(12) United States Patent
Okamoto (10) Patent No.: US 8,185,858 B2
(45) Date of Patent: May 22, 2012

(54) APPARATUS, METHOD, AND PROGRAM FOR PREDICTING LAYOUT WIRING CONGESTION

(75) Inventor: Shinichiro Okamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 408 days.

(21) Appl. No.: 12/511,452

(22) Filed: Jul. 29, 2009

(65) Prior Publication Data

US 2010/0031219 A1 Feb. 4, 2010

(30) Foreign Application Priority Data

Jul. 31, 2008 (JP) ................................. 2008-197566

(51) Int. Cl.
  *G06F 17/50* (2006.01)
(52) U.S. Cl. ...................... 716/122; 716/132; 716/136
(58) Field of Classification Search .................. None
  See application file for complete search history.

(56) References Cited

U.S. PATENT DOCUMENTS

| | | | | |
|---|---|---|---|---|
| 5,550,714 A | * | 8/1996 | Nishiyama | 716/124 |
| 5,867,398 A | * | 2/1999 | Scepanovic et al. | 716/123 |
| 6,099,577 A | * | 8/2000 | Isobe | 716/103 |
| 6,223,328 B1 | * | 4/2001 | Ito et al. | 716/113 |
| 6,282,693 B1 | * | 8/2001 | Naylor et al. | 716/114 |
| 6,405,358 B1 | * | 6/2002 | Nuber | 716/111 |
| 6,789,243 B2 | * | 9/2004 | Nakagawa et al. | 716/124 |
| 6,857,107 B2 | * | 2/2005 | Nagasaka et al. | 716/113 |
| 7,143,385 B2 | * | 11/2006 | Itou et al. | 716/131 |
| 7,921,392 B2 | * | 4/2011 | Furnish et al. | 716/110 |
| 2009/0217231 A1 | * | 8/2009 | Ban | 716/18 |

FOREIGN PATENT DOCUMENTS

| | | |
|---|---|---|
| JP | 2005-302062 | 10/2005 |
| JP | 2007-115159 | 5/2007 |

* cited by examiner

*Primary Examiner* — Leigh Garbowski
(74) *Attorney, Agent, or Firm* — Wolf, Greenfield & Sacks, P.C.

(57) ABSTRACT

A layout-wiring-congestion prediction apparatus. The layout-wiring-congestion prediction apparatus includes: a circuit-data providing section providing circuit data; a conversion processing section converting the provided circuit data into directed graph data; a node-placement-coordinate calculation processing section calculating individual node placement coordinates of the directed graph data produced by the conversion processing section; a node-placement-density calculation section calculating a node-placement density on the basis of the individual node placement coordinates calculated by the node-placement-coordinate calculation processing section; and a node-placement-density error determination processing section determining the node-placement density calculated by the node-placement-density calculation section to be an error if the node-placement density is higher than an error-determination threshold value.

8 Claims, 7 Drawing Sheets

ERROR LIST:
LIST-OUTPUT CIRCUITS HAVING NODE DENSITY OF ERROR
THRESHOLD VALUE OR HIGHER
ERROR THRESHOLD VALUE (NUMBER OF NODES/UNIT AREA) = 200

| INSTANCE NAME | NODE DENSITY >= 100 |
|---|---|
| top/test/misr1 | 340 |
| top/test/misr2 | 280 |
| top/dmac1 | 270 |
| top/dmac2 | 250 |

APPARATUS, METHOD, AND PROGRAM FOR PREDICTING LAYOUT WIRING CONGESTION

BACKGROUND OF THE INVENTION

1. Field of the Invention

The present invention relates to an apparatus, method, and program for predicting layout-wiring congestion of a semiconductor integrated circuit.

2. Description of the Related Art

Various EDA (Electronic Design Automation) tools have been on the market for design tools of semiconductor integrated circuits (LSIs).

As techniques for efficiently executing automatic placement and wiring of LSIs, there have been widespread techniques for performing simulations in an environment similar to an actual state of executing placement and wiring on a chip using a net list and a cell library.

In order to perform simulations as the techniques described above, it is necessary to provide detailed physical parameters, such as the sizes of cells, the size of a chip, and the width of a wiring line.

Also, a huge amount of time is necessary for performing such a simulation using the detailed data.

Also, proposals have been made on techniques for predicting congested points of layout wiring using a net list (for example, refer to Japanese Unexamined Patent Application Publication Nos. 2007-115159 and 2005-302062).

Japanese Unexamined Patent Application Publication No. 2007-115159 has disclosed a technique for estimating a cell which will cause wiring congestion and reducing the wiring congestion degree by prohibiting the use of the cell.

Japanese Unexamined Patent Application Publication No. 2005-302062 has disclosed a technique for reducing wiring congestion by extracting high fan-out nets on the basis of a net list and timing restriction information.

SUMMARY OF THE INVENTION

As described above, in the above-described techniques, it is unclear whether placement and wiring are possible or not unless a simulation of placement and wiring, which takes a huge amount of time, is executed.

Accordingly, if it becomes clear that the layout is not possible after the simulation of placement and wiring, there has been a problem in that a rework becomes necessary, and thus a great delay occurs in the development process.

Also, in the technique disclosed in Japanese Unexamined Patent Application Publication No. 2007-115159, a responsible cell for the congestion is prohibited to be used, and thus there might be an increase in the total number of wiring lines and the total cell area in the layout as a result.

In the technique disclosed in Japanese Unexamined Patent Application Publication No. 2005-302062, an optimum layout is obtained in consideration of the timing and the wiring congestion degree of a logical device to be designed.

Accordingly, the layout is carried out by automatic wiring, and thus it takes time until the result is obtained. For example, if a rework becomes necessary, there is a problem in that a great process delay occurs, etc., in the same manner as described above.

It is desirable to provide an apparatus, method, and program for predicting layout-wiring congestion, which allows easy confirmation of a wiring congestion degree and significant reduction of a process delay without increasing the cell area.

According to an embodiment of the present invention, there is provided a layout-wiring-congestion prediction apparatus including: a circuit-data providing section providing circuit data; a conversion processing section converting the provided circuit data into directed graph data; a node-placement-coordinate calculation processing section calculating individual node placement coordinates of the directed graph data produced by the conversion processing section; a node-placement-density calculation section calculating a node-placement density on the basis of the individual node placement coordinates calculated by the node-placement-coordinate calculation processing section; and a node-placement-density error determination processing section determining the node-placement density calculated by the node-placement-density calculation section to be an error if the node-placement density is higher than an error-determination threshold value.

The layout-wiring-congestion prediction apparatus, preferably, further includes an error-determination result output section outputting an error determination result by the node-placement-density error determination processing section.

In the layout-wiring-congestion prediction apparatus, the error-determination result output section preferably list-outputs a circuit list having the error-determination threshold value or higher.

The layout-wiring-congestion prediction apparatus, preferably, further includes: a display section; and a drawing processing section drawing a node and an edge of the directed graph data on a screen of the display section on the basis of the on the basis of the node placement coordinates calculated by the node-placement-coordinate calculation processing section.

According to another embodiment of the present invention, there is provided a method of predicting layout-wiring-congestion, the method including the steps of: a first step converting circuit data provided from a providing section into directed graph data by a conversion processing section; a second step calculating, by a node-placement-coordinate calculation processing section, individual node placement coordinates of the directed graph data produced in the first step; a third step calculating, by a node-placement-density calculation processing section, a node placement density on the basis of the individual node placement coordinates of the directed graph data calculated in the second step; and a fourth step determining the node placement density to be an error if the node-placement density calculated by a determination processing section in the third step is higher than an error-determination threshold value.

According to another embodiment of the present invention, there is provided a program for causing a computer to perform data processing including the steps of: first processing converting circuit data provided from a providing section into directed graph data by a conversion processing section; second processing calculating, by a node-placement-coordinate calculation processing section, individual node placement coordinates of the directed graph data produced in the first processing; third processing calculating, by a node-placement-density calculation processing section, a node placement density on the basis of the individual node placement coordinates of the directed graph data calculated in the second processing; and fourth processing determining the node placement density to be an error if the node-placement density calculated by a determination processing section in the third processing is higher than an error-determination threshold value.

In the present invention, a conversion processing section converts circuit data provided from a circuit-data providing section into directed graph data, and supplies the directed graph data to a node-placement-coordinate calculation processing section.

The node-placement-coordinate calculation processing section calculates individual node placement coordinates of the directed graph data, and supplies the calculation result to a node-placement-density calculation section.

The node-placement-density calculation section calculates a node-placement density on the basis of the individual node placement coordinates of the directed graph data, and supplies the calculation result to a node-placement-density error determination processing section.

And the node-placement-density error determination processing section determines the calculated node-placement density to be an error if the calculated node-placement density is higher than an error-determination threshold value.

By the present invention, it is possible to easily confirm a wiring congestion degree and to significantly reduce a process delay without increasing the cell area.

DESCRIPTION OF THE PREFERRED EMBODIMENTS

In the following, a description will be given of an embodiment of the present invention with reference to the drawings.

Figure 1:
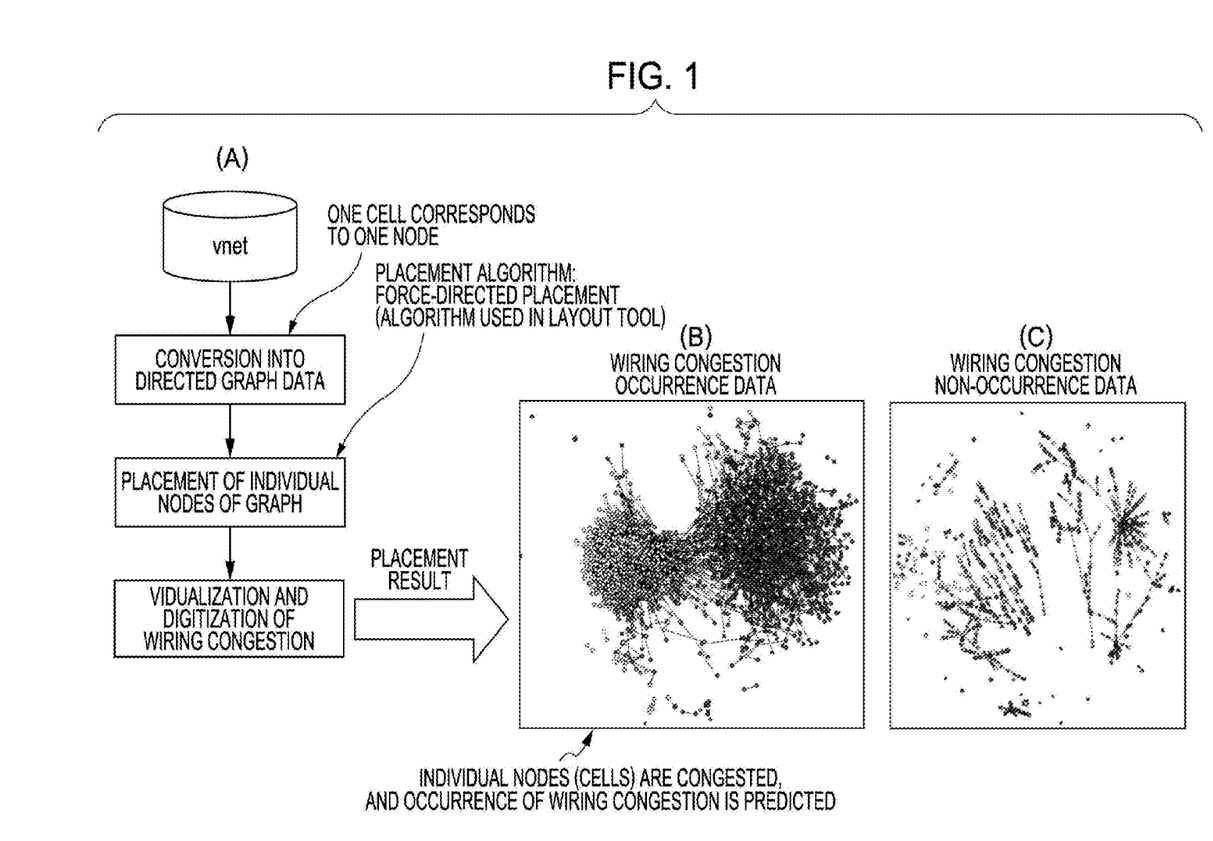
FIG. 1 is a diagram illustrating an overview of a method for predicting layout-wiring congestion, according to the present embodiment.

FIG. 1 is a diagram illustrating an overview of a method for predicting layout-wiring congestion, according to the present embodiment.

Figure 2:
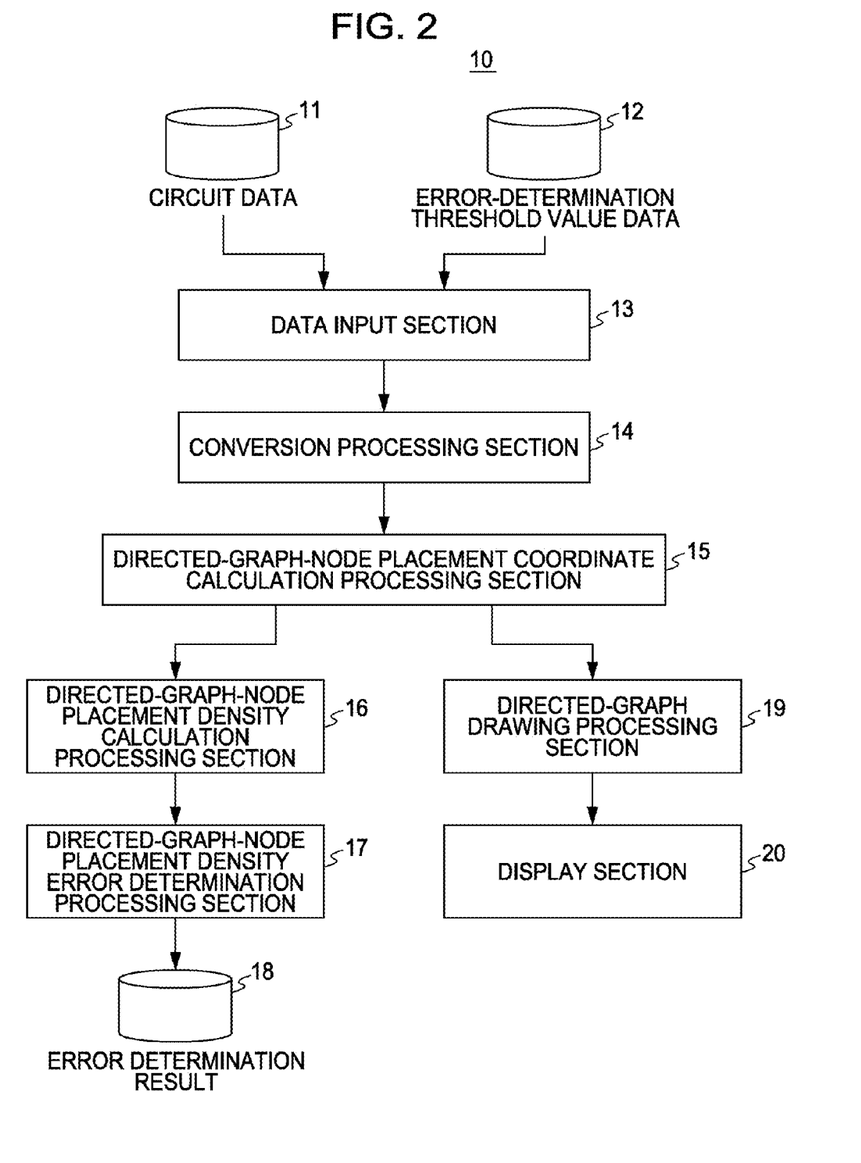
FIG. 2 is a block diagram illustrating an example of the configuration of a layout-wiring-congestion prediction apparatus according to an embodiment of the present invention.

FIG. 2 is a block diagram illustrating an example of the configuration of a layout-wiring-congestion prediction apparatus according to the embodiment of the present invention.

In the method for predicting layout-wiring-congestion, according to the present embodiment, as shown in FIG. 1(A), logical design data (vnet) is converted into directed graph data, and individual nodes of the graph is placed on the coordinates using the layout placement algorithm. In the present embodiment, one cell corresponds to one node.

Thus, a prediction is made on the wiring congestion degree.

The wiring congestion degree is visualized and is expressed numerically.

In the visualization, FIG. 1(B) shows an example of the occurrence data of wiring congestion, and FIG. 1(C) shows an example of non-occurrence data of wiring congestion.

In the example of the occurrence data of a wiring congestion in FIG. 1(B), individual nodes (cells) are congested, and the occurrence of wiring congestion is easily predicted.

In accordance with such a basic concept, as shown in FIG. 2, the layout-wiring-congestion prediction apparatus 10 has a circuit-data providing section 11, an error-determination threshold value data providing section 12, a data input section 13, a conversion processing section 14, a directed-graph-node placement coordinate calculation processing section 15. Further, the layout-wiring-congestion prediction apparatus 10 has a directed-graph-node placement density calculation processing section 16, a directed-graph-node placement density error determination processing section 17, an error-determination-result output section 18, a directed-graph drawing processing section 19, and a display section 20.

The circuit-data providing section 11 supplies circuit data to the data input section 13.

The circuit data is supplied by reading circuit data from a database, for example, or by inputting through the input section, such as a keyboard, etc.

The error-determination threshold value data providing section 12 supplies error-determination threshold value data VTHE, which is determination criteria data for determining an error in the case where the directed-graph-node placement density is a specified threshold value or higher.

The data input section 13 inputs (reads) a net list, which is the circuit data from supplied the circuit-data providing section 11, and a cell library, and reads the error-determination threshold value data VTHE of the directed-graph-node placement density, supplied from the error-determination threshold value data providing section 12. The data input section 13 stores the input circuit data and the error-determination threshold value data into the memory.

The conversion processing section 14 converts the circuit data input through the data input section 13 into directed graph data, and stores the converted data into the memory not shown in the figure.

The directed-graph-node placement coordinate calculation processing section 15 calculates individual node placement coordinates of the directed graph node stored in the memory using a graph drawing algorithm, and stores the node placement coordinates of the calculation result into the memory not shown in the figure.

The directed-graph-node placement density calculation processing section 16 calculates node placement density on the basis of the individual node placement coordinates of the directed graph data calculated by the directed-graph-node placement coordinate calculation processing section 15.

The directed-graph-node placement density error determination processing section 17 determines that an error has occurred if the node placement density calculated by the directed-graph-node placement density calculation processing section 16 is higher than the error-determination threshold value data VTHE.

The error-determination-result output section 18 outputs the error determination result produced by the directed-graph-node placement density error determination processing section 17.

The directed-graph drawing processing section 19 draws the nodes and the edges of the directed graph data on the basis of the node placement coordinates calculated by the directed-graph-node placement coordinate calculation processing section 15 on the screen of the display section 20.

The display section 20 is formed, for example, by a liquid crystal display apparatus (LCD). The nodes and the edges of the directed graph data are displayed on the display section 20 by the directed-graph drawing processing section 19.

The layout-wiring-congestion prediction apparatus 10 according to the present embodiment has a function of displaying the nodes and the edges of the directed graph data converted from the circuit data on a GUI screen and a function of outputting the nodes and the edges of the directed graph data converted from the circuit data into an image file.

In the following, an example of a display on a GUI screen and an example of an output of an image file are shown.

Figure 3:
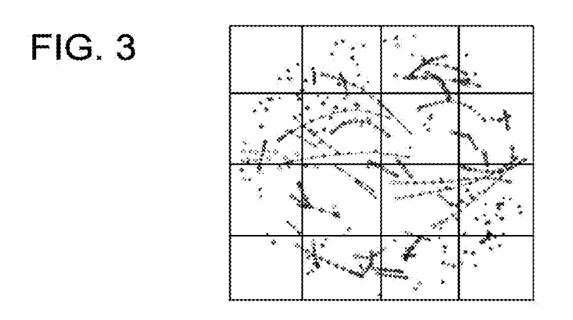
FIG. 3 is a diagram illustrating an example of a GUI display of nodes and edges of directed graph data, and is an example of the case where the node density is low and the possibility of the occurrence of wiring congestion is low.
Figure 4:
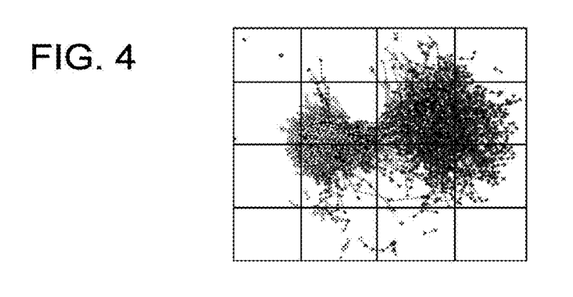
FIG. 4 is a diagram illustrating an example of a GUI display of nodes and edges of directed graph data, and is an example of the case where node density is high and the possibility of the occurrence of wiring congestion is high.

FIGS. 3 and 4 are diagrams illustrating examples of GUI displays of the nodes and the edges of directed graph data.

FIG. 3 illustrates an example of the case where the directed-graph node density is low and the possibility of the occurrence of wiring congestion is low.

Also, FIG. 4 illustrates an example of the case where the directed-graph node density is high and the possibility of the occurrence of wiring congestion is high.

Figure 5:
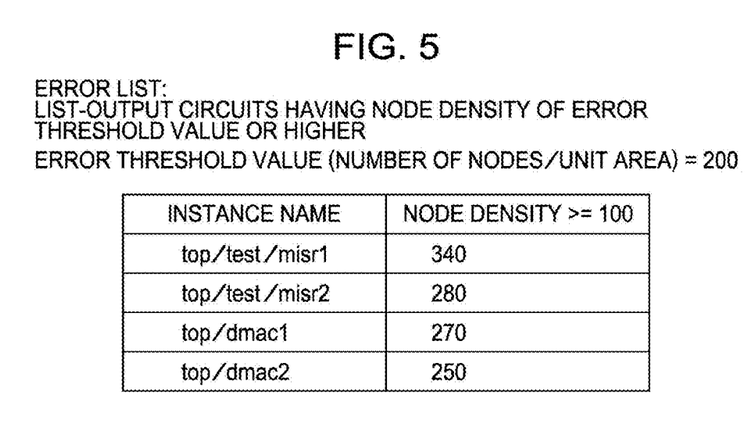
FIG. 5 is a diagram illustrating an output example of an error-determination result output section according to the present embodiment.

FIG. 5 is a diagram illustrating an output example of an error-determination result output section according to the present embodiment.

In the example of FIG. 5, circuits having a node density of an error threshold value or higher are output as an error list.

Also, in this example, the error threshold value is set to 200 in terms of the number of nodes/unit area.

In FIG. 5, the error-determination-result output section 18 outputs the circuits having a node density of the error threshold value or higher and the corresponding node densities thereof.

Specifically, the instance name [top/test/misr1] has a node density of "340", the instance name [top/test/misr2] has a node density of "280", the instance name [top/dmac1] has a node density of "270", and the instance name [top/dmac2] has a node density of "250".

Next, a description will be given of the overall operation of the layout-wiring-congestion prediction apparatus 10 of FIG. 1 in relationship to FIG. 6.

Figure 6:
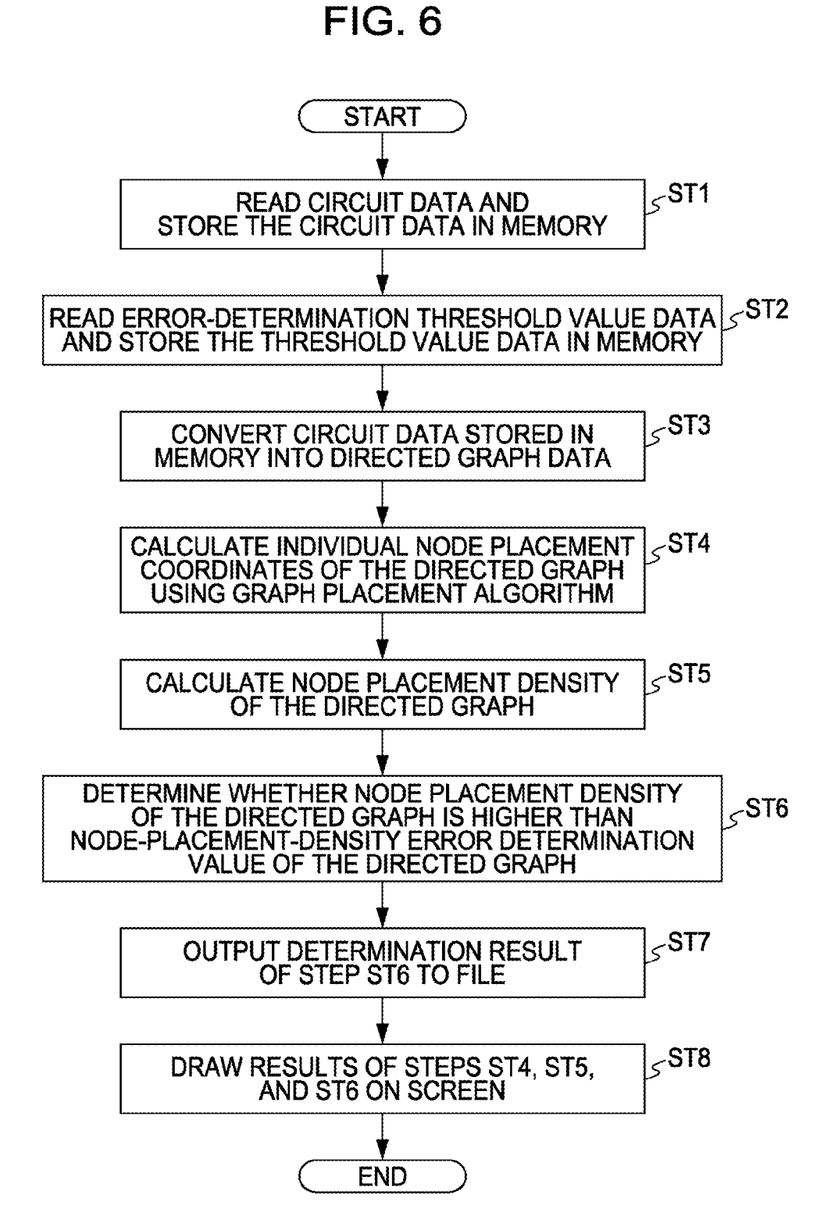
FIG. 6 is a flowchart illustrating an overview of a basic operation of the layout-wiring-congestion prediction apparatus 10 in FIG. 1.

FIG. 6 is a flowchart illustrating an overview of the basic operation of the layout-wiring-congestion prediction apparatus 10 of FIG. 1.

Step ST1

First, in step ST1, the data input section 13 reads circuit data from the circuit-data providing section 11, and stores the circuit data in the memory.

Step ST2

Next, in step ST2, the data input section 13 reads error-determination threshold value data from the error-determination threshold value data providing section 12, and stores the error-determination threshold value data in the memory.

Step ST3

Next, in step ST3, the conversion processing section 14 converts the circuit data in the memory into directed graph data, and stores the converted data in the memory.

Step ST4

Next, in step ST4, the node placement coordinate calculation processing section 15 calculates individual node placement coordinates of the directed graph stored in the memory using the graph placement algorithm.

Step ST5

Next, in step ST5, the node placement density calculation processing section 16 calculates placement densities of the individual nodes of the directed graph.

Step ST6

Next, in step ST6, the node placement density error determination processing section 17 determines whether the placement densities of the individual nodes of the directed graph are higher than the error-determination threshold value.

The directed-graph-node placement density error determination processing section 17 determines the node placement density to be an error if the node placement density calculated by the directed-graph-node placement density calculation processing section 16 is higher than the error-determination threshold value data VTHE.

Step ST7

Next, in step ST7, the error-determination-result output section 18 outputs the error determination result by the directed-graph-node placement density error determination processing section 17.

Step ST8

Also, in step ST8, the directed-graph drawing processing section 19 draws the nodes and the edges of the directed graph data on the basis of the node placement coordinates calculated by the directed-graph-node placement coordinate calculation processing section 15 on the screen of the display section 20.

In this case, the results of steps ST4, ST5, and ST6 are drawn on the screen of the display section 20.

FIGS. 7(A) to 7(G) are diagrams illustrating a wiring-congestion degree map and the wiring-congestion prediction output data corresponding to the map.

Figure 7:
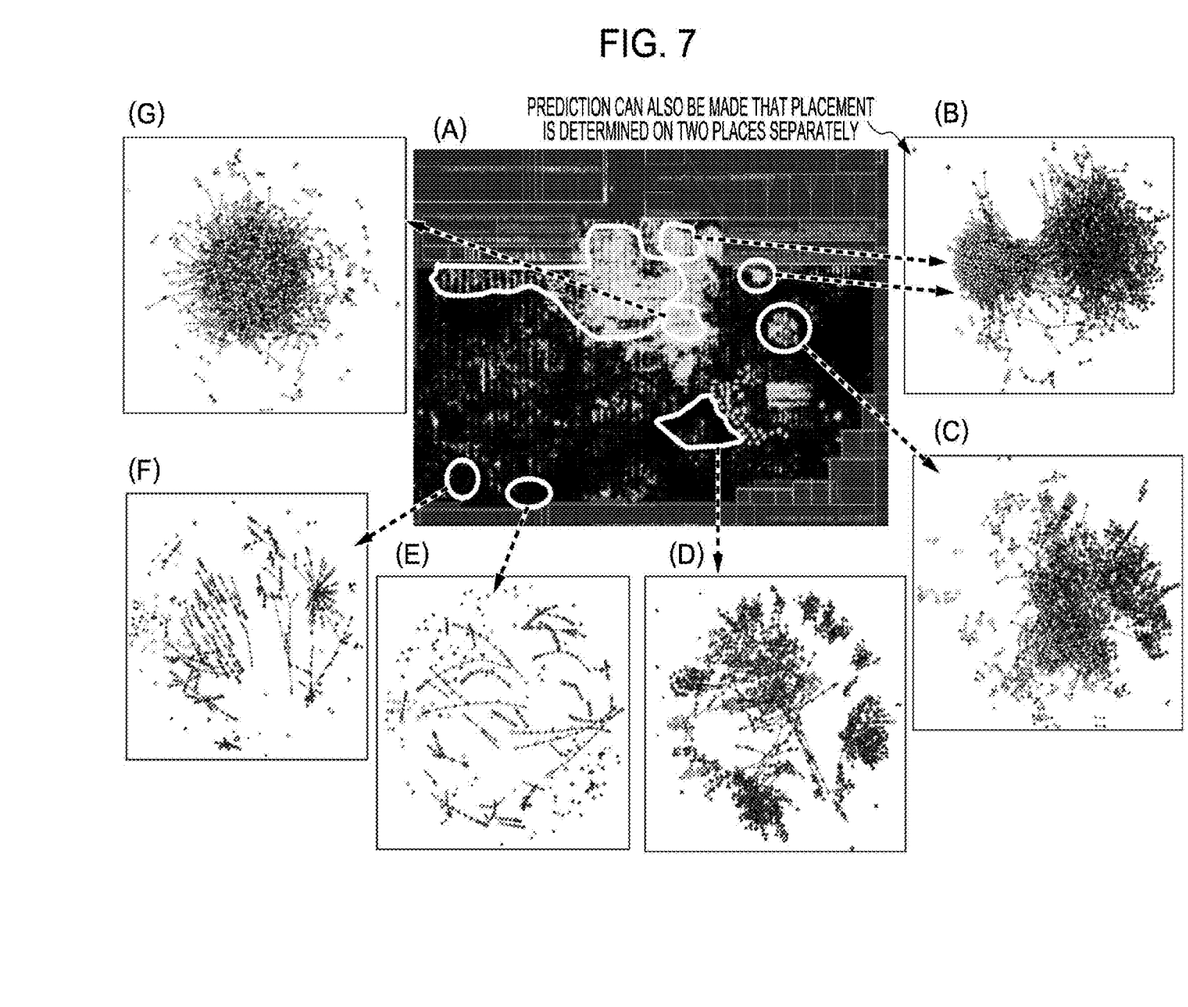
FIG. 7 is a diagram illustrating a wiring-congestion degree map and the wiring-congestion prediction output data corresponding to the map.

FIG. 7(A) shows the wiring-congestion degree map and FIGS. 7(B) to 7(G) show the wiring-congestion prediction output data.

FIG. 7(B) corresponds to a display example of FIG. 4, and FIG. 7(E) corresponds to a display example of FIG. 3.

Out of the wiring-congestion prediction output data in FIGS. 7(B) to 7(G), in the cases of FIGS. 7(B), 7(C), 7(D), and 7(G), the node density of the directed graph data is high, and there is a high probability that the wiring congestion is determined to occur.

In the cases of FIGS. 7(E) and 7(F), the node density of the directed graph data is low, and there is a high probability that the wiring congestion is determined not to occur.

Also, in the output data in FIG. 7(B), a prediction can also be made that placement is determined to be on two places separately.

Also, it can be said that there is a high correlation between the node density and the wiring congestion degree.

In particular, there is a high correlation between the maximum number of logical stages between flip-flops (between F/Fs) as registers and the wiring congestion degree.

FIGS. 8(A) to 8(D) are diagrams illustrating a correlation between the maximum number of logical steps between F/Fs and the wiring-congestion degree.

Figure 9A:
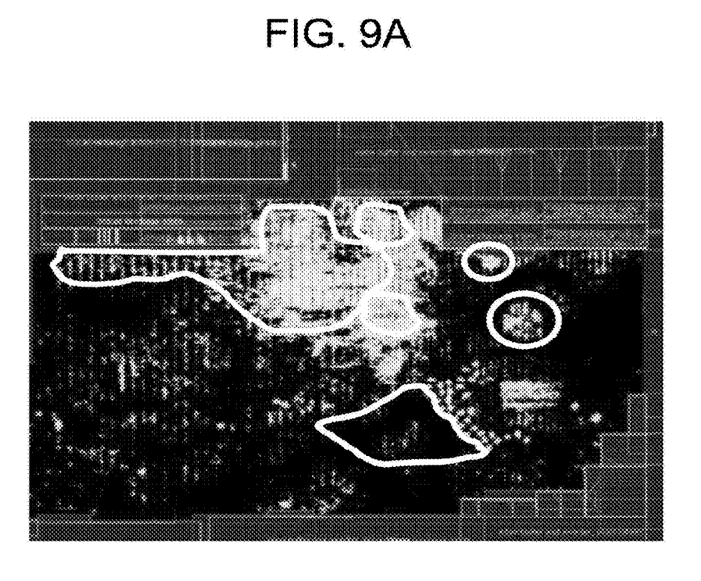
FIG. 9 is a diagram illustrating a wiring-congestion degree map and the corresponding cell density map.
Figure 9B:
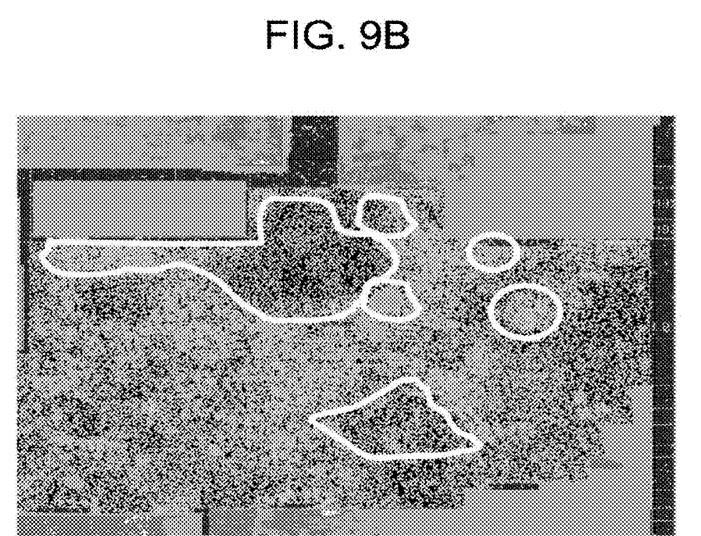

FIGS. 9(A) and 9(B) are diagrams illustrating a wiring-congestion degree map and the corresponding cell density map.

Figure 8:
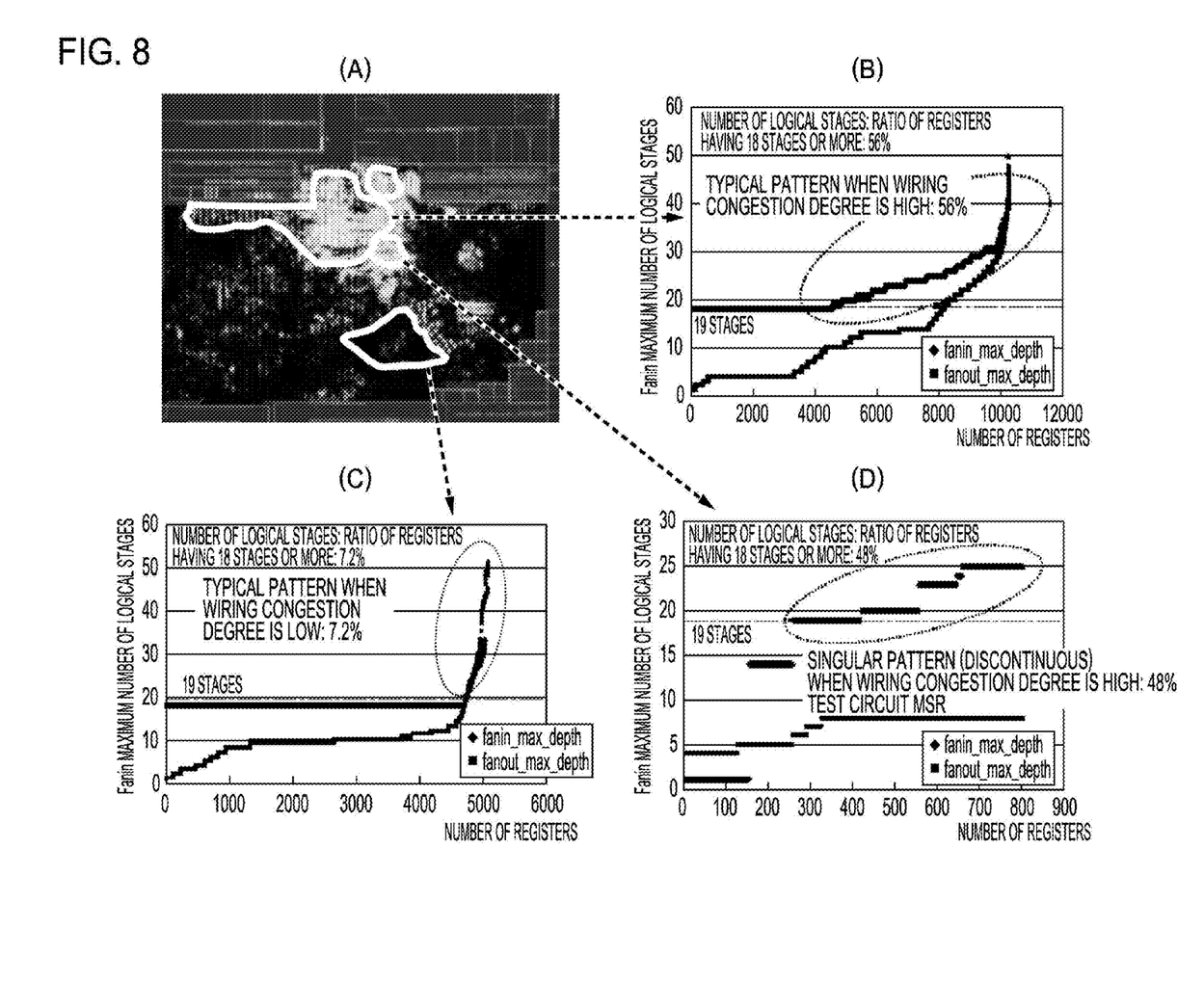
FIG. 8 is a diagram illustrating a correlation between the maximum number of logical steps between F/Fs and a wiring-congestion degree.

FIG. 8(A) shows a wiring-congestion degree map, FIG. 8(B) shows a relationship between the number of registers (F) and fan-ins when the wiring congestion degree is high, and FIG. 8(C) shows a relationship between the number of registers (F) and fan-ins when the wiring congestion degree is low. Also, FIG. 8(D) shows a relationship between the number of registers (F) and fan-ins in a singular pattern (discontinuous) when the wiring congestion degree is high.

An analysis has been made by obtaining 14 kinds of data, such as the number of fan-ins and the number of fan-outs for each instance from design data. As a result, a high correlation with the "wiring-congestion degree" has been seen on "the maximum number of logical stages between F/Fs".

That is to say, it has been confirmed that there is a high correlation between the maximum logical stages between the F/Fs and the "wiring-congestion degree".

FIG. 9 shows the resultant data tendency obtained by the experiment.

In the case where "the occupation rate of registers having a lot of logical stages is high", "the cell density is considered to be high".

If the number of logical stages is large, there is a high possibility that proximity placement may occur because of a timing problem.

If "the cell density is high", "the wiring-congestion degree is considered to be high"

If the cell density becomes high, the pin density also becomes high, and the pin area occupies a large portion of the wiring area as a result.

By the above estimation, if "the occupation rate of registers having a lot of logical stages is high", "the wiring-congestion degree is high" in conclusion.

As described above, according to the embodiment, the layout-wiring-congestion prediction apparatus 10 has the circuit-data providing section 11 providing circuit data, and the conversion processing section 14 converting the circuit data into directed graph data.

The layout-wiring-congestion prediction apparatus 10 further has the directed-graph-node placement coordinate calculation processing section 15 calculating individual node placement coordinates of the directed graph data produced by the conversion processing section 14.

The layout-wiring-congestion prediction apparatus 10 has the directed-graph-node placement density calculation processing section 16 calculating node placement densities on the basis of the individual node placement coordinates of the directed graph data calculated by the node placement coordinate calculation processing section 15.

The layout-wiring-congestion prediction apparatus 10 has the directed-graph-node placement density error determination processing section 17 determining that an error has occurred if the node placement density calculated by the node placement density calculation processing section 16 is higher than an error determination threshold value.

The layout-wiring-congestion prediction apparatus 10 has the error-determination-result output section 18 outputting the error determination result determined by the node placement density error determination processing section 17.

Further, the layout-wiring-congestion prediction apparatus 10 has the display section 20 and the directed-graph drawing processing section 19 drawing the nodes and edges of the directed graph data onto the screen of the display section 20 on the basis of the node placement coordinates calculated by the node placement coordinate calculation processing section 15.

Accordingly, the following advantages can be obtained by the present embodiment.

That is to say, by the present embodiment, it becomes possible to detect a circuit which is likely to cause wiring congestion in advance by examining the net list before performing the simulation of the actual placement and wiring, and thus it is possible to prevent problems that occur after the simulation of the placement and wiring from occurring.

As a result, it becomes possible to reduce reworks.

To put it another way, by the present embodiment, it is possible to easily confirm a wiring congestion degree and to significantly reduce a process delay without increasing the cell area.

In this regard, it is possible to form the method described above in detail as programs in accordance with the above-described procedures, and to cause a CPU, etc., of a computer to execute the programs.

Also, such programs may be contained in a recording medium, such as a semiconductor memory, a magnetic disk, an optical disc, a floppy (registered trademark) disk, etc., and a computer may accesses the recording medium included therein in order to execute the above-described programs.

The present application contains subject matter related to that disclosed in Japanese Priority Patent Application JP 2008-197566 filed in the Japan Patent Office on Jul. 31, 2008, the entire content of which is hereby incorporated by reference.

It should be understood by those skilled in the art that various modifications, combinations, sub-combinations and alterations might occur depending on design requirements and other factors insofar as they are within the scope of the appended claims or the equivalents thereof.

What is claimed is:

1. A layout-wiring-congestion prediction apparatus comprising:
   a circuit-data providing section providing circuit data;
   a conversion processing section converting the provided circuit data into directed graph data;
   a node-placement-coordinate calculation processing section calculating individual node placement coordinates of the directed graph data produced by the conversion processing section;
   a node-placement-density calculation section calculating a node-placement density based on the individual node placement coordinates calculated by the node-placement-coordinate calculation processing section; and
   a node-placement-density error determination processing section determining the node-placement density calculated by the node-placement-density calculation section to be an error when the node-placement density is higher than an error-determination threshold value.

2. The layout-wiring-congestion prediction apparatus according to claim 1, further comprising
   an error-determination result output section outputting an error determination result by the node-placement-density error determination processing section.

3. The layout-wiring-congestion prediction apparatus according to claim 2,
   wherein the error-determination result output section list-outputs a circuit list having the error-determination threshold value or higher.

4. The layout-wiring-congestion prediction apparatus as in any one of claims 1 to 3, further comprising:
   a display section; and
   a drawing processing section drawing a node and an edge of the directed graph data on a screen of the display section based on the node placement coordinates calculated by the node-placement-coordinate calculation processing section.

5. A method of predicting layout-wiring-congestion, the method comprising steps of:
   a first step of converting circuit data provided from a providing section into directed graph data by a conversion processing section;

a second step of calculating, by a node-placement-coordinate calculation processing section, individual node placement coordinates of the directed graph data produced in the first step;

a third step of calculating, by a node-placement-density calculation processing section, a node placement density based on the individual node placement coordinates of the directed graph data calculated in the second step; and a fourth step of determining the node placement density to be an error when the node-placement density is higher than an error-determination threshold value.

6. The method of predicting layout-wiring-congestion according to claim 5, further comprising:

a fifth step of displaying a node and an edge of the directed graph data converted from the circuit data; and a sixth step of providing as an output the node and the edge of the directed graph data converted from the circuit data.

7. A computer-readable storage medium having computer-executable instructions that, when executed by a computer, cause the computer to perform a method of data processing comprising steps of:

converting circuit data provided from a providing section into directed graph data by a conversion processing section;

calculating, by a node-placement-coordinate calculation processing section, individual node placement coordinates of the directed graph data;

calculating, by a node-placement-density calculation processing section, a node placement density based on the individual node placement coordinates of the directed graph data; and determining the node placement density to be an error when the node-placement density is higher than an error-determination threshold value.

8. The computer-readable storage medium of claim 7, further comprising the steps of:

displaying a node and an edge of the directed graph data converted from the circuit data; and providing as an output the node and the edge of the directed graph data converted from the circuit data.

* * * * *